US006661018B1

(12) United States Patent
McGregor et al.

(10) Patent No.: US 6,661,018 B1
(45) Date of Patent: Dec. 9, 2003

(54) SHROUD NOZZLE FOR GAS JET CONTROL IN AN EXTREME ULTRAVIOLET LIGHT SOURCE

(75) Inventors: Roy D. McGregor, El Camino Village, CA (US); Charles W. Clendening, Jr., Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/559,303

(22) Filed: Apr. 25, 2000

(51) Int. Cl.$^7$ ................................................. H05H 1/04
(52) U.S. Cl. ............................. 250/504 R; 250/492.22
(58) Field of Search .......................... 250/504 R, 423 P, 250/492.22; 430/311; 378/119

(56) References Cited

U.S. PATENT DOCUMENTS

| | | | |
|---|---|---|---|
| 4,663,567 A | 5/1987 | Wong | |
| 5,577,092 A | 11/1996 | Kublak et al. | |
| 6,007,963 A | 12/1999 | Felter et al. | |
| 6,011,267 A | 1/2000 | Kubiak et al. | |
| 6,031,598 A | 2/2000 | Tichenor et al. | |
| 6,190,835 B1 * | 2/2001 | Haas et al. | 430/311 |
| 6,469,310 B1 * | 10/2002 | Fiedorowicz et al. | 250/492.2 |

OTHER PUBLICATIONS

Fiedorowicz, H., et al.: *Characterization and Optimization of a Laser–Produced X–Ray Source with a Gas Puff Target*, Proceedings of the SPIE, Bellingham, VA, vol. 3767, Jul. 21, 1999, pp. 10–20.

Bruijn, Rene de, et al.: *Characterization of a Novel Double–Gas–Jet Laser–Plasma EUV Source*, Proceedings of the SPIE, SPIE, Bellingham, VA, vol. 3997, Feb. 28, 2000, pp. 157–161.

* cited by examiner

Primary Examiner—Bruce Anderson
Assistant Examiner—Phillip A Johnston
(74) Attorney, Agent, or Firm—John A. Miller; Warn, Burgess & Hoffmann, P.C.

(57) ABSTRACT

A gas jet nozzle (20, 60) for an extreme-ultraviolet light (EUV) source, including a housing (22, 62) having a front (24, 64) and a back (26, 66). The housing (22, 62) is coupleable to a primary gas source (44) and a secondary gas source (46) and is adapted to. expel primary gas (36, 76) and secondary gas (42, 82) from the housing front (24, 64). The housing (22, 62) has a gas-expelling primary channel (39, 70) located centrally within the housing (22, 62) and a gas-expelling secondary channel (34, 74) proximate the primary channel (39, 70). The primary channel (39, 70) may be circular and the secondary channel (34, 74) may be annular, surrounding the primary channel (39, 70). A secondary gas stream (42, 82) expelled from the secondary channel (34, 74) restricts the lateral expansion of a primary gas stream (36, 76) expelled from the primary channel (39, 70), optimizing gas jet properties and reducing heating and erosion of the nozzle (20, 60).

22 Claims, 4 Drawing Sheets

SHROUD NOZZLE FOR GAS JET CONTROL IN AN EXTREME ULTRAVIOLET LIGHT SOURCE

TECHNICAL FIELD OF THE INVENTION

The present invention is generally related to semiconductor lithography techniques and equipment, and more particularly to extreme ultraviolet (EUV) lithography.

BACKGROUND OF THE INVENTION

The recent trend towards the miniaturization of electronic circuits is driven by consumer demand for smaller and light-weight electronic devices such as cellular phones, PDA's and portable computers, for example. Optical projection lithography is a lithographic technique where light is refracted through camera lenses onto a masked semiconductor wafer to pattern a particular layer. This lithographic technique is currently used for the high volume manufacture of circuits having etched circuit lines of 0.18 micron dimensions or greater in width. However, the present technology for optical projection lithography cannot produce circuits with substantially smaller features due to fundamental physical limitations on the ability to focus light—smaller circuit features require a source of shorter wavelength light.

An emerging next-generation lithographic (NGL) technique in semiconductor technology is extreme ultraviolet (EUV) lithography, an advanced technology for making integrated circuits smaller and more powerful. In EUV lithography, intense beams of very short wavelength ultraviolet (UV) light are reflected from a circuit design pattern and refracted by mirrors through camera lenses into a silicon wafer.

A candidate technology for a practical EUV light source is a laser-produced plasma (LPP). In a LPP EUV source, a target material is illuminated by a high-power laser to produce a very high temperature plasma which radiates the desired EUV light. The present invention pertains to a light source in which a condensable gas (vapor) is passed through a nozzle assembly in such a manner so as to produce a jet or spray containing a plurality of small droplets along with some uncondensed gas. This plurality of droplets serves collectively as the target of the laser.

SUMMARY OF THE INVENTION

The present invention achieves technical advantages as a gas jet nozzle having a housing with a secondary channel for gas flow that restricts the lateral expansion of gas flowing from the primary channel. In one embodiment, a gas jet nozzle for an extreme ultraviolet (EUV) light source comprises a housing having a primary channel adapted to couple to a primary gas source and expel a first gas/droplet stream. The housing also includes a secondary channel proximate the primary channel adapted to couple to a secondary gas source and adapted to expel a second gas stream. The second gas stream shapes the first gas/droplet stream expelled by the primary channel.

Also disclosed is a gas jet nozzle system for an extreme ultraviolet light (EUV) source, comprising a primary gas source, a secondary gas source, and a housing. The housing comprises a primary channel coupled to the primary gas source and adapted to expel a first gas/droplet stream. The housing further comprises a secondary channel proximate the primary channel coupled to the secondary gas stream. The housing secondary channel is adapted to expel a second gas stream to shape the first gas/droplet stream expelled by the housing primary channel.

Further disclosed is a method of converting laser energy to EUV energy, comprising the steps of expelling gas from a nozzle and illuminating the expelled gas with a laser to produce EUV light-emitting plasma. The nozzle comprises a housing having a primary channel and a secondary channel proximate the primary channel. The primary channel is coupled to a primary gas source, and the secondary channel is coupled to a secondary gas source. A first gas/droplet stream is expelled from the primary channel and a second gas stream is expelled from the secondary channel, where the second gas stream shapes the first gas/droplet stream.

Advantages of the invention include the ability to illuminate the stream expelled from the primary channel with a laser at a distance further away from nozzles of the prior art without the loss of performance that would occur due to spreading of the expelled stream in the prior art. This is beneficial because damage to the nozzle from the generated high temperature plasma is significantly reduced, resulting in longer life of the nozzle and saving replacement costs. Furthermore, costs are reduced for replacing collection optics that become contaminated by the nozzle erosion by-products. The life of the collection optics is further increased by the fact that the secondary shroud gas flow serves to directly block some of the very fast atoms or ions emitted from the plasma that would otherwise impinge upon and erode the collection optics. Also, the nozzle of the present invention blocks a smaller fraction of the emitted EUV light from reaching the collection optics, as compared to the prior art.

BRIEF DESCRIPTION OF THE DRAWINGS

In the drawings, which form an integral part of the specification and are to be read in conjunction therewith:

FIG. 4 illustrates a perspective view of an embodiment of the gas jet nozzle of the present invention in;

Like numerals and symbols are employed in different figures to designate similar components in various views unless otherwise indicated.

DETAILED DESCRIPTION OF PREFERRED EMBODIMENTS

Figure 1:
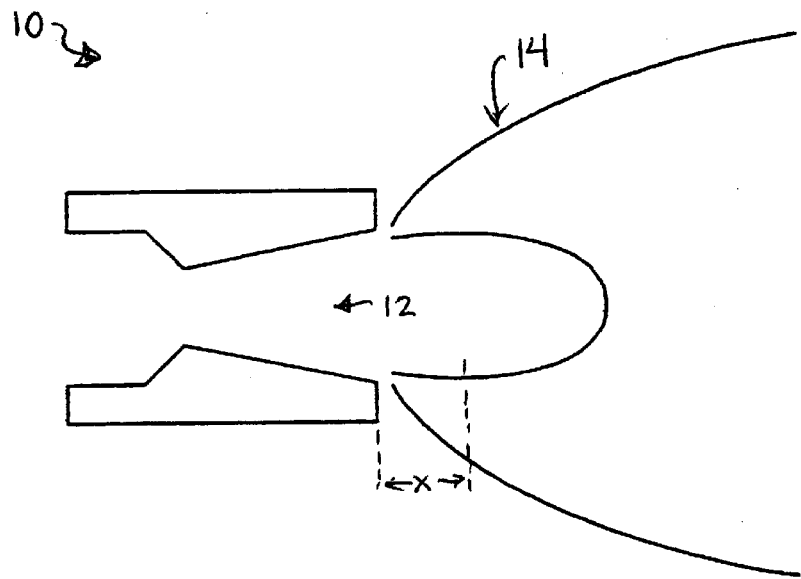
FIG. 1 is a cross-sectional view of a EUV lithography gas jet nozzle of the prior art having a single channel.

Laser-illuminated gas jets are the leading candidate as the means for production of EUV light for the next generation of semiconductor lithography equipment. A prior art gas jet nozzle 10 used in EUV lithography is shown in FIG. 1. The nozzle 10 has a single channel 12 for expelling gas. The gas undergoes rapid lateral expansion as it leaves the nozzle exit, shown generally at 14. This is problematic in that when used with EUV lithography, a high-power laser is focused on the expelled gas to produce a high temperature plasma which emits EUV light.

Because the gas expelled from the prior art nozzle 10 expands laterally rapidly as shown at 14, the laser must be focused close to the nozzle 10, for example, at a distance "x" away from the nozzle 10, to illuminate the necessary quantity of target gas and achieve adequate performance. High temperature plasma is generated close to the nozzle 10 within distance "x", which results in heating and erosion of the nozzle 10 and degradation in nozzle performance. Moreover, the nozzle erosion by-products contaminate other optical equipment in the system. Furthermore, the nozzle 10 blocks a significant portion of the emitted EUV light and prevents the EUV light from reaching the collection optics, e.g. lenses and mirrors, not shown.

What is needed in the art is a gas jet nozzle design that solves the lateral gas expansion problems of the prior art. The present invention achieves technical advantages as a nozzle having a primary channel, and a secondary channel disposed proximate the primary channel emitting gas that restricts the lateral expansion of gas from the main, primary channel.

Figure 2:
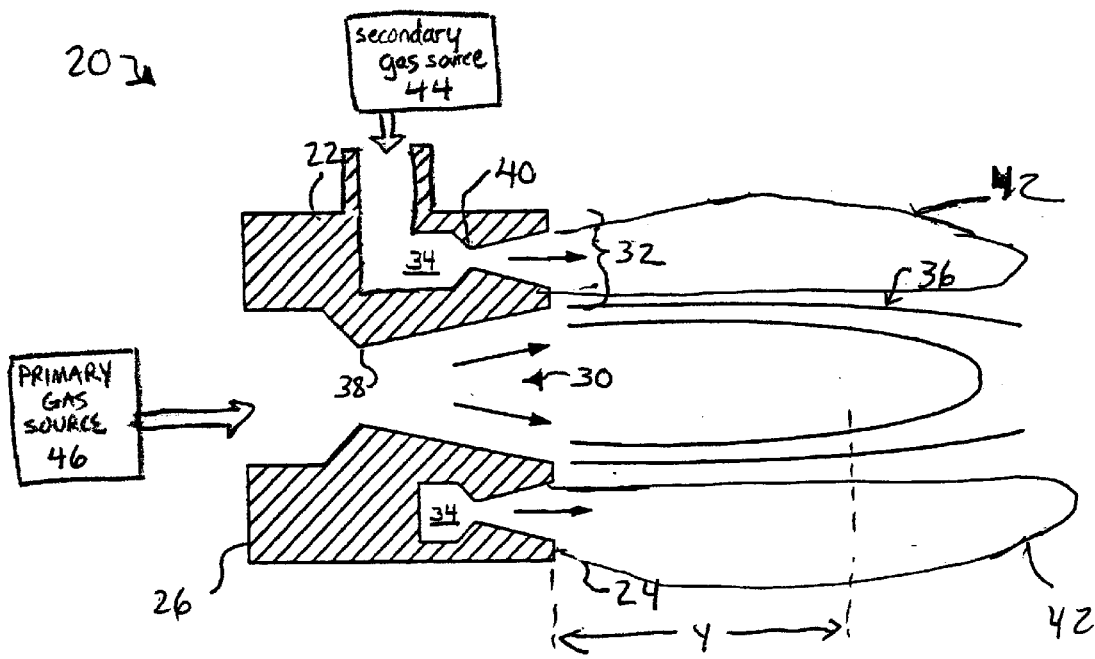
FIG. 2 is a cross-sectional view of an EUV lithography gas jet nozzle of the present invention having a primary channel coupled to a primary gas source and an annular secondary channel coupled to a secondary gas source.
Figure 3:
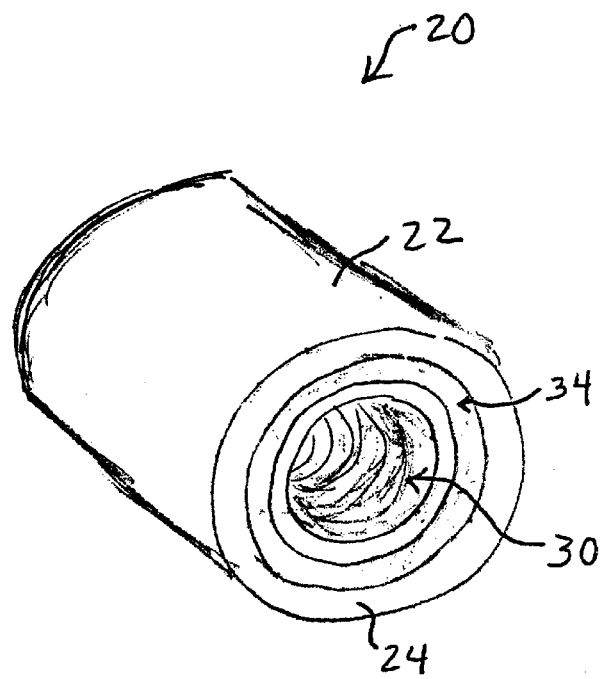
FIG. 3 shows a front perspective view of the EUV lithography gas jet nozzle of the present invention.

A first embodiment of a gas jet nozzle of the present invention is shown generally at 20 in a cross-sectional view in FIG. 2, and in a perspective front view in FIG. 3. Shown is the gas jet nozzle 20 adapted to produce extreme ultraviolet (EUV) light including a cylindrical housing 22 preferably comprising stainless steel having an annular front face 24 and an annular back face 26. The housing 22 has a gas-expelling primary channel 30 located axially and centrally within the housing 22, and a gas-expelling secondary channel 34 disposed proximate the primary channel 30. The housing 22 is adapted to couple to a primary gas source 46 preferably comprising xenon and a diluent, for example, at the back face 26. The housing 22 is adapted to expel a primary gas stream 36 at the front 24 via the primary channel 30 that forms EUV when illuminated with a laser. The secondary channel 34 of the housing 22 is adapted to coupled to a secondary gas source 44 and is adapted to expel a secondary gas stream 42. The secondary gas source 44 preferably comprises a non-condensing gas, for example, helium.

The cross-sectional profile of primary channel 30 is preferably circular but may be oval, for example; and the secondary channel 34 is preferably ring-like or annular, annularly surrounding the primary channel 30. The secondary channel 34 is preferably located in an annular shroud 32 that is preferably comprised of a homogeneous material coupled to or molded into the nozzle housing 22, although the shroud may also be a separate component. The primary channel 30 has a larger diameter at the housing front (nozzle exit) 24 than a rearward point (throat) 38 near the housing back (inlet) 26 thereby forming a converging/diverging channel shape that efficiently produces droplets in the subsequent external jet. The secondary channel 34 has a larger diameter at the housing front 24 than a rearward point 40 disposed proximate the housing front 24 to expand the secondary gas flow provided therethrough to high velocity and form the well-collimated, high-momentum annular jet flow shown at 42. Although FIG. 2 shows the secondary channel centerline as parallel to the primary channel centerline, the preferred embodiment is to have the secondary channel oriented to direct the secondary gas flow radially inward at some angle.

The present invention derives technical advantages whereby the annular jet stream 42 expelled from the annular secondary channel 34 provides a jet "envelope" that applies a pneumatic pressure and a momentum ("dynamic pressure") that restricts the lateral expansion of primary gas stream 36 expelled from the primary channel 30, thereby optimizing gas jet properties by providing a narrow, coherent dense primary stream 36. By proper selection of the geometry and flow conditions of the secondary channel 34, the annular jet of secondary gas 42 provides the desired density of the target gas 36 at a more favorable distance "y" from the nozzle 20 exit opening. Preferably, the gas forming the gas flow stream 42 from the secondary channel 34 is selected to be optically transparent to both the directed laser and generated EUV light. The increased displacement "y" of the laser focus and required gas density from the nozzle 20 is significantly greater than displacement "x" of prior art nozzles, and is beneficial in many respects.

Figure 4:
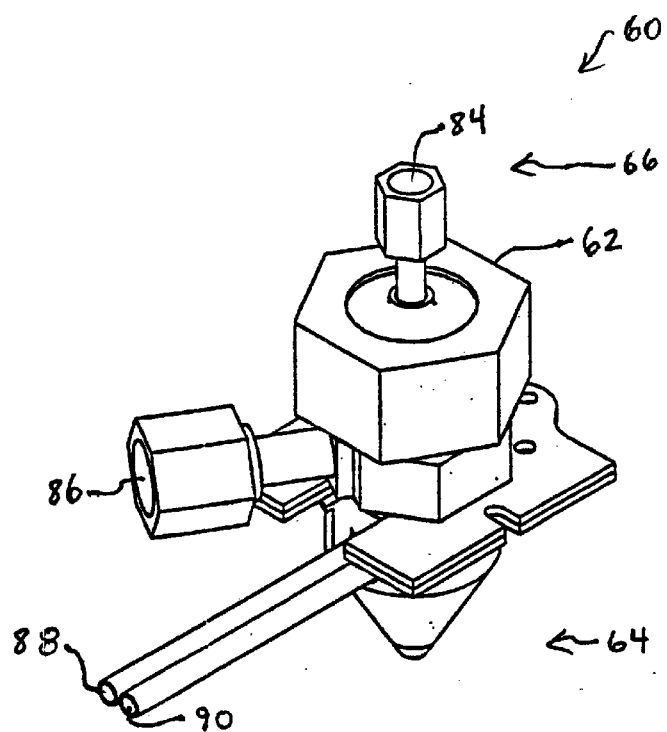

A second embodiment of the present invention is shown generally at 60 in the perspective view of FIG. 4. A housing 62 may comprise several assemblies coupled together, to be described further herein. The primary gas source 46 (not shown) is coupleable to a primary gas inlet 84 at a housing back 66, and the secondary gas source 44 (not shown) is coupleable to a secondary or shroud gas inlet 86 preferably on the side of the housing 66. An optional coolant inlet 88 and coolant outlet 90 located near the housing front 64 are coupleable to a coolant supply (not shown) and route coolant about housing 62 to reduce operating temperatures thereof when generating EUV.

Figure 5:
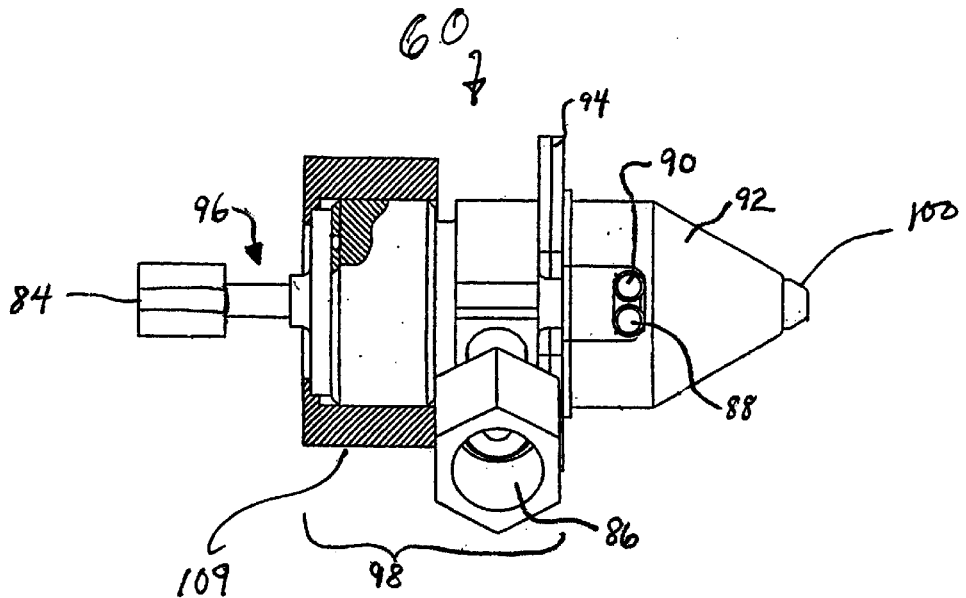
FIG. 5 shows a side view of the embodiment shown in FIG. 4 having a nozzle assembly coupled to a sleeve assembly and cooling jacket.

A side view of the gas jet nozzle 60 is shown in FIG. 5. A cooling jacket 92 having a tapered tip is coupled to and covers a nozzle assembly 96 and is coupled to a sleeve assembly 98. A shim may be coupled to the sleeve assembly 98, for example.

Figure 6:
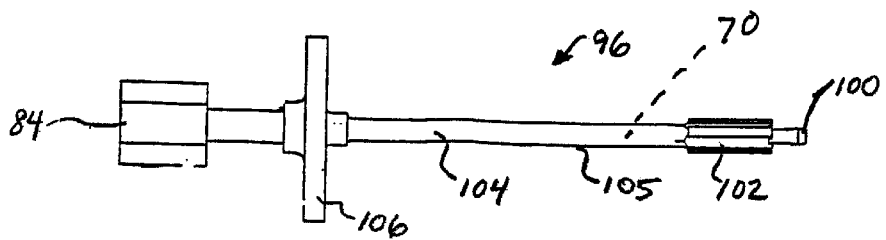
FIG. 6 illustrates a nozzle assembly providing the primary channel of the present invention.
Figure 8:
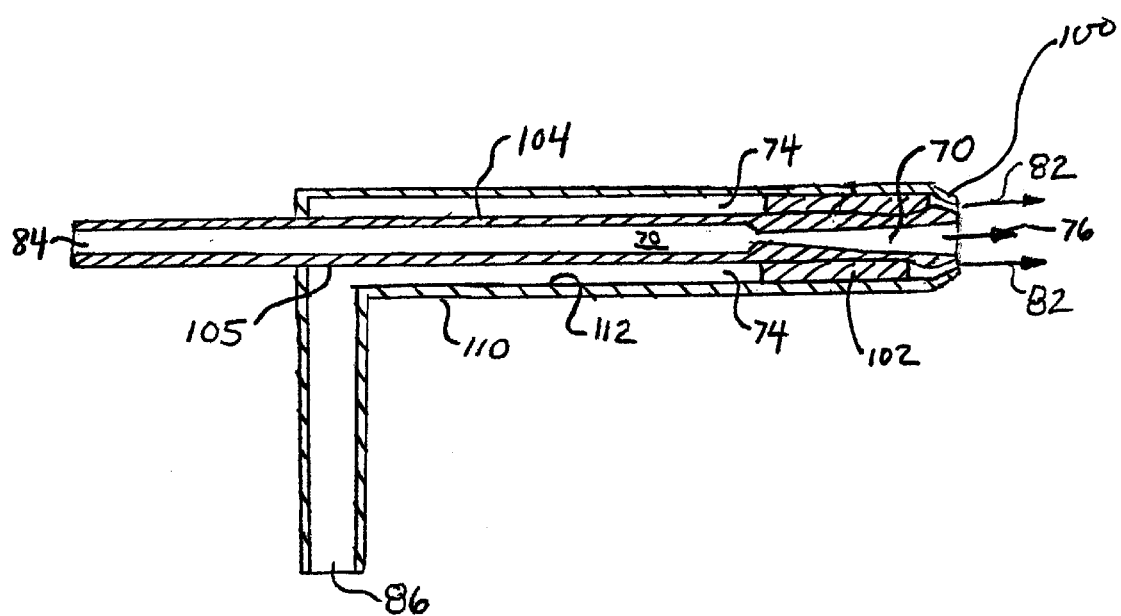
FIG. 8 is a cross-sectional view of the tubular members of the present invention that form the gas-emitting primary channel and secondary channel.

The nozzle assembly 96 is shown separately in FIG. 6. Preferably, the nozzle assembly 96 comprises a hollow tube 104 that encloses a primary gas-expelling channel 70. The tube 104 has an external surface 105 and is terminated at a distal end to form a primary nozzle tip 100 having the preferred dimensions as described with reference to FIG. 2. An optional positioning attachment 102 may be defined about tip 100 and comprise wire that serves to adjustably position the nozzle tip 100 within the sleeve assembly 98 and adjust the orientation of the flow of secondary gas stream 82 therethrough, as shown in FIG. 8. Preferably the sleeve assembly 98 has an inwardly extending splined section (not shown) that keeps the tube 104 securely centered within the sleeve assembly 98 while allowing passage of the secondary gas stream therebetween. The tube 104 has a flange 106 securely defined near the primary gas inlet 84, as shown, which is secured to and against a nut 108 by a flanged cover 109, as shown in FIG. 5.

Figure 7:
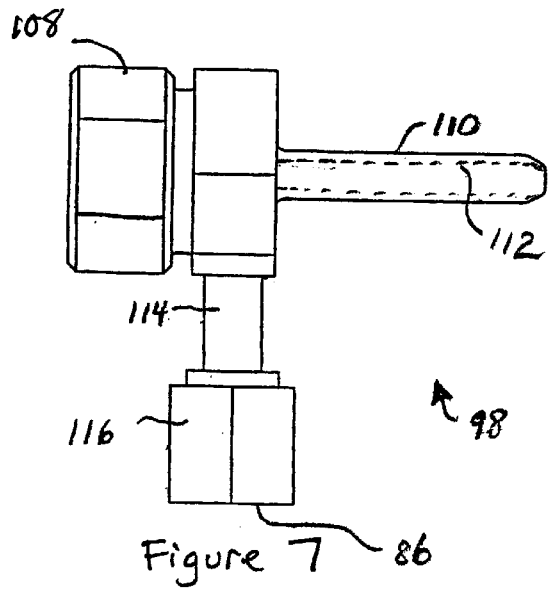
FIG. 7 shows a sleeve assembly of the present invention providing the secondary channel.

The sleeve assembly 98 is shown separately in FIG. 7 comprising a tube 110 having an interior surface 112. The tube 110 has a larger diameter than tube 104 of the nozzle assembly 96. Tube 110 of the sleeve assembly 98 is positioned over and around the tube 104 of the nozzle assembly 96 so that an annular cavity is formed between the external surface 105 of tube 104 and the interior surface 112 of tube 110, forming a secondary channel 74. The sleeve assembly 98 comprises the shroud or secondary gas inlet 86. The sleeve assembly 98 also comprises a fitting 114 and a coupling nut 116 for receiving the secondary gas source.

A cross-section of a portion of the assembled gas jet nozzle 60 of the present invention is shown in FIG. 8, illustrating the secondary 74 channel formed between the exterior surface 105 of nozzle assembly tube 104 and the interior surface 112 of the sleeve assembly tube 110. Primary gas, enters the primary gas inlet 84 and passes through the primary channel 70. The primary gas is expelled from the primary nozzle tip 100 as a primary stream 76. Secondary gas enters the secondary gas inlet 86 and passes through the secondary channel 74. The secondary gas is expelled proximate the primary stream 76 near the opening of the nozzle tip 100 and forms an enveloping secondary gas stream 82 restricting the lateral expansion of the primary gas stream 76 as previously described.

The novel gas jet nozzle 20, 60 disclosed and described herein provides several advantages. The annular gas flow stream 42, 82 from the annular secondary channel 34, 74, respectively, provides pneumatic pressure about and to the gas flow stream 36, 76 from the primary channel 30, 70, respectively, restricting the lateral expansion of the main gas flow stream 36, 76, respectively. The gas stream 42, 82 from the secondary channel 34, 74, respectively, axially guides the primary gas stream 36, 76, respectively, to be emitted from the nozzle 20, 60 in a more perpendicular direction to the plane defined by front face 24. To generate EUV light, a laser is illuminated into the gas flow 36 and focused at a distance "y" away from the exit at the nozzle front 24. This is beneficial for several reasons. First, damage to the nozzle 20, 60 from the generated high temperature plasma is significantly reduced, resulting in longer life of the nozzle 20, 60 which results in a substantial reduction in the cost of EUV lithography equipment and repair and replacement costs. Second, because the nozzle 20, 60 is positioned farther from the plasma generated, the nozzle has higher performance characteristics than prior art nozzles 10. Third, the nozzle 20, 60 does not block a fraction of the emitted EUV light from reaching the collection optics, as in the prior art. Furthermore, costs are reduced by reducing the replacement of collection optics that may become contaminated by the nozzle erosion by-products.

Though the invention has been described with respect to a specific preferred embodiment, many variations and modifications will become apparent to those skilled in the art upon reading the present application. For example, while the EUV jet nozzle 20, 60 is described herein with respect to semiconductor lithography, the jet nozzle design 20, 60 is beneficial for other EUV applications, such as materials science and microscopy, for example. The nozzle 20, 60 housing 22, 62 preferably comprises a material suitable for a high temperature environment, and resistant to sputtering by high-velocity ions and atoms emitted from the plasma. The primary gas 36, 76 discussed herein is preferably xenon, but may comprise other suitable gases (alone or in combination) for EUV lithography, for example. The secondary gas 42, 82 discussed herein is preferably helium, but may comprise other suitable non-condensing gases, for example. Additionally, there is a wide range of possible geometries for both the primary channel and the secondary shroud-gas channel that may be considered in an attempt to optimize the characteristics of the primary stream while simultaneously meeting other requirements of an operational system. It is therefore the intention-that the appended claims be interpreted as broadly as possible in view of the prior art to include all such variations and modifications.

What is claimed is:

1. A gas jet nozzle for an extreme ultraviolet light (EUV) source, comprising:

a housing adapted to coupled to a primary gas source and adapted to expel a first gas/droplet stream, said housing comprising a primary channel located within said housing adapted to expel said first gas/droplet stream, said housing further comprising a secondary channel adapted to couple to a secondary gas source and adapted to expel a second gas stream, said housing further comprising a secondary channel adapted to couple to a secondary gas source and adapted to expel a second gas stream to shape said first gas stream expelled by said primary channel, said secondary channel being a tapered channel so that the secondary gas expands as it travels through the second channel to be expelled therefrom.

2. A gas jet nozzle for an extreme ultraviolet light (EUV) source, comprising:

a housing adapted to couple to a primary gas source and adapted to expel a first gas/droplet stream, said housing comprising a primary channel located within said housing adapted to expel said first gas/droplet stream, said housing further comprising a secondary channel adapted to couple to a secondary gas source and adapted to expel a second gas stream to shape said first gas stream expelled by said primary channel, said secondary channel being a tapered channel so that the secondary gas expands as it travels through the second channel to be expelled therefrom, wherein said secondary channel is configured such that said second gas stream expelled from said secondary channel restricts the lateral expansion of said first gas/droplet stream expelled from said primary channel, optimizing gas jet properties.

3. The nozzle of claim 2 wherein said primary channel has a circular cross-section, wherein said secondary channel is annular and surrounds said primary channel.

4. The nozzle of claim 3 wherein said primary channel has a narrowed portion sized to provide the desired rate of mass flow through said primary channel.

5. The nozzle of claim 4 wherein said secondary channel has a narrowed portion sized to provide the desired rate of mass flow through said secondary channel.

6. The nozzle of claim 3 wherein said housing is cylindrical and comprises an annular shroud containing said secondary channel.

7. The nozzle of claim 1 wherein said housing comprises a nozzle assembly containing said primary channel and a sleeve assembly coupled around said nozzle assembly, said secondary channel being formed between said nozzle assembly and said sleeve assembly.

8. A gas jet nozzle system for an extreme ultraviolet light (EUV) source, comprising:

a primary gas source;

a housing comprising a primary channel coupled to said primary gas source and adapted to expel a first gas/droplet stream, said housing further comprising a secondary channel; and a secondary gas source coupled to said secondary channel, wherein said housing secondary channel is adapted to expel a second gas stream to shape said first gas/droplet stream expelled by said housing primary channel, said secondary channel being a tapered channel so that the secondary gas expands as it travels through the second channel to be expelled therefrom.

9. A gas jet nozzle system for an extreme ultraviolet light (EUV) source, comprising:

a primary gas source;

a housing comprising a primary channel coupled to said primary gas source and adapted to expel a first gas/droplet stream, and a secondary channel; and a secondary gas source coupled to said secondary channel, wherein said secondary channel is adapted to expel a second gas stream to shape said first gas/droplet stream expelled by said primary channel, said secondary channel being a tapered channel so that the secondary gas expands as it travels through the second channel to be expelled therefrom, wherein said secondary channel is configured such that said second gas stream expelled from said secondary channel restricts the lateral expansion of said first gas/droplet stream expelled from said primary channel, optimizing gas jet properties.

10. The nozzle system of claim 9 wherein said secondary channel is disposed about said primary channel.

11. The nozzle system of claim 10 wherein said primary channel has a narrowed portion adapted to provide the desired rate of mass flow through said primary channel.

12. The nozzle system of claim 11 wherein said secondary channel has a narrowed portion adapted to provide the desired rate of mass flow through said secondary channel.

13. The nozzle system of claim 9 wherein said housing is cylindrical and includes a tubular said primary channel, and includes an annular shroud containing said secondary channel.

14. The nozzle system of claim 9 wherein said housing comprises a nozzle assembly containing said primary channel and a sleeve assembly coupled around said nozzle assembly, said secondary being channel formed between said nozzle assembly and said sleeve assembly.

15. The nozzle system of claim 8 wherein said secondary gas source comprises a different gas than said first gas source and is optically transparent to a laser source of light.

16. A method of converting laser energy to EUV energy, comprising the steps of:

expelling gas from a nozzle, said nozzle comprising a housing having a primary channel and a secondary channel, said primary channel being coupled to a primary gas source, said secondary channel being coupled to a secondary gas source, wherein a first gas/droplet stream is expelled from said primary channel and a second gas stream is expelled from said secondary channel, said secondary channel being a tapered channel so that the secondary gas expands as it travels through the second channel to be expelled therefrom, said second gas stream shaping said first gas/droplet stream; and illuminating said shaped first gas/droplet stream with a laser to produce EUV light-emitting plasma.

17. The method of claim 16 wherein said expelled second gas stream restricts the lateral expansion of said expelled first gas/droplet stream.

18. The method of claim 17 wherein said housing comprises an annular shroud surrounding said primary channel, said annular shroud containing said secondary channel.

19. The method of claim 18 wherein said primary channel has a narrowed portion adapted to provide the desired rate of mass flow through said primary channel.

20. The method of claim 19 wherein said secondary channel has a narrowed portion adapted to provide the desired rate of mass-flow through said secondary channel.

21. The method of claim 16 wherein predetermined properties of said expelled first gas/droplet stream are achieved a predetermined distance away from said housing.

22. The method of claim 16 wherein said primary gas comprises xenon and said secondary gas comprises helium.

* * * * *

UNITED STATES PATENT AND TRADEMARK OFFICE
CERTIFICATE OF CORRECTION

PATENT NO. : 6,661,018 B1
DATED : December 9, 2003
INVENTOR(S) : McGregor et al.

It is certified that error appears in the above-identified patent and that said Letters Patent is hereby corrected as shown below:

Title page,
Item [57], ABSTRACT,
Line 1, "extreme-ultraviolet" should be -- extreme ultraviolet --
Lines 1-17, "39" should be -- 30 -- (each occurrence).

Column 3,
Line 44, "coupled" should be -- couple --.
Line 49, "example;" should be -- example, --.

Column 5,
Line 6, "gas," should be -- gas --.
Line 62, "intention-that" should be -- intention that --.

Column 6,
Line 1, "coupled" should be -- couple --.

Column 8,
Line 28, "mass-flow" should be -- mass flow --.

Signed and Sealed this

Third Day of January, 2006

JON W. DUDAS
*Director of the United States Patent and Trademark Office*